United States Patent
Takesako et al.

(10) Patent No.: US 10,209,273 B2
(45) Date of Patent: Feb. 19, 2019

(54) PROBE POSITION INSPECTION APPARATUS, SEMICONDUCTOR DEVICE INSPECTION APPARATUS AND SEMICONDUCTOR DEVICE INSPECTION METHOD

(71) Applicant: Mitsubishi Electric Corporation, Tokyo (JP)

(72) Inventors: Norihiro Takesako, Tokyo (JP); Takaya Noguchi, Tokyo (JP); Akira Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 15/206,339

(22) Filed: Jul. 11, 2016

(65) Prior Publication Data
US 2017/0102410 A1   Apr. 13, 2017

(30) Foreign Application Priority Data
Oct. 7, 2015   (JP) .................. 2015-199058

(51) Int. Cl.
| G01R 1/067 | (2006.01) |
| G01R 1/04  | (2006.01) |
| G01R 3/00  | (2006.01) |

(52) U.S. Cl.
CPC .......... G01R 1/06794 (2013.01); G01R 1/04 (2013.01); G01R 3/00 (2013.01); *G01R 1/06722* (2013.01)

(58) Field of Classification Search
CPC .. G01R 1/06794; G01R 1/06722; G01R 1/04; G01R 3/00
(Continued)

(56) References Cited

U.S. PATENT DOCUMENTS 6,002,426 A  * 12/1999  Back .................. H04N 7/181
                                                        324/750.23
8,212,577 B2   7/2012  Yamada et al.
(Continued)

FOREIGN PATENT DOCUMENTS

| CN | 101551231 A | 10/2009 |
| CN | 202102019 U | 1/2012 |

(Continued)

OTHER PUBLICATIONS

An Office Action mailed by the Japanese Patent Office dated Oct. 16, 2018, which corresponds to Japanese Patent Application No. 2015-199058 and is related to U.S. Appl. No. 15/206,339; with English translation.

(Continued)

*Primary Examiner* — Melissa Koval
*Assistant Examiner* — Trung Nguyen
(74) *Attorney, Agent, or Firm* — Studebaker & Brackett PC

(57) ABSTRACT

A probe position inspection apparatus capable of inspecting the position of contact portions of respective probe tips easily and accurately, an apparatus for inspecting a semiconductor device, and a method of inspecting a semiconductor device are provided. The probe position inspection apparatus includes a transparent plate, a camera for taking an image of one surface of the transparent plate, and a pressure passive member covering the other surface of the transparent plate. The tip of a probe for use in evaluation of a semiconductor device is pressed against the other surface of the transparent plate, with the pressure passive member therebetween. The probe position inspection apparatus further includes an image processor for processing the image taken by the camera to detect the position of the probe in the plane of the transparent plate.

19 Claims, 6 Drawing Sheets

(58) Field of Classification Search
USPC ............... 324/750.01, 500, 507, 513, 523, 324/750.15–750.22, 754.19, 756.01, 324/762.01, 600, 612, 76.11; 382/145, 382/151, 100, 153
See application file for complete search history.

(56) References Cited

U.S. PATENT DOCUMENTS

| | | |
|---|---|---|
| 2009/0251163 A1 | 10/2009 | Yamada et al. |
| 2013/0252443 A1* | 9/2013 | Hotta ................... G01R 1/0735 439/66 |
| 2014/0210500 A1 | 7/2014 | Akiyama et al. |
| 2014/0352737 A1* | 12/2014 | Ookouchi ......... H01L 21/67051 134/30 |
| 2015/0377921 A1* | 12/2015 | Ukraintsev ............ G01Q 30/02 324/750.19 |

FOREIGN PATENT DOCUMENTS

| | | |
|---|---|---|
| CN | 102768013 A | 11/2012 |
| CN | 103308734 A | 9/2013 |
| CN | 103969565 A | 8/2014 |
| JP | H01-282829 A | 11/1989 |
| JP | H04-283672 A | 10/1992 |
| JP | 05-157790 A | 6/1993 |
| JP | 2001-189353 A | 7/2001 |
| JP | 2009-198407 A | 9/2009 |
| JP | 2011-049261 A | 3/2011 |

OTHER PUBLICATIONS

An Office Action mailed by the State Intellectual Property Office dated Nov. 19, 2018, which corresponds to Chinese Patent Application No. 201610873769.3 and is related to U.S. Appl. No. 15/206,339; with English translation.

* cited by examiner

PROBE POSITION INSPECTION APPARATUS, SEMICONDUCTOR DEVICE INSPECTION APPARATUS AND SEMICONDUCTOR DEVICE INSPECTION METHOD

BACKGROUND OF THE INVENTION

Field of the Invention

The present invention relates to a probe position inspection apparatus, a semiconductor device inspection apparatus, and a semiconductor device inspection method.

Description of the Background Art

A semiconductor device inspection apparatus has been known which makes an evaluation of electrical characteristics of a semiconductor device that is an object to be measured by bringing the tips of probes into contact with the semiconductor device. The term "semiconductor device" used herein refers to a semiconductor wafer or a chip obtained by dicing of a semiconductor wafer. For inspection, the semiconductor device is fixed on the surface of a chuck stage by vacuum suction and the like. Then, the probes for electrical input and output come from above into contact with an electrode of the semiconductor device.

In the inspection of a semiconductor device having a vertical structure in which large current is passed in a vertical direction of the semiconductor device, that is, from one main surface of the semiconductor device to the other main surface thereof, the surface of the chuck stage serves as an electrode. The higher pin counts of the probes have hitherto been achieved to meet the requirement for the application of large current and high voltage.

During the evaluation of the electrical characteristics of the semiconductor device that is an object to be measured, it is important to bring a plurality of probes into contact with an electrode provided on the surface of the semiconductor device with high accuracy. When a misalignment of the contact portions of the probes coming into contact with the electrode occurs, there are cases in which desired current or voltage is not applied to the semiconductor device. In addition, there can be cases in which the contact of the contact portions of the probes with other than the electrode results in the destruction of the semiconductor device. To suppress the misalignment of the contact portions of the probes, it is desirable that the probes have a short length. However, there is a tendency to increase the length of the probes to thereby increase the distance between the main body portion of a probe card and the semiconductor device for the purpose of suppressing a discharge phenomenon. Thus, the misalignment of the contact portions of the probes is prone to occur.

Under these circumstances, a non-contact type technique has been known as a probe position measuring method. An example of the non-contact type probe position measuring technique includes image processing measurement by means of a camera provided in opposed relation to probes. It is, however, difficult for this image processing measurement to carry out accurate measurements because of the presence of disturbance factors such as the background, distance, individual focusing and the influence of deposits during the position measurements of the tips of the probes.

Another evaluation method is disclosed in Japanese Patent Application Laid-Open No. 2001-189353 in which probes are brought into contact with a deformable body and thereafter separated from the deformable body, and the position and size of probe marks are observed. Also, the elimination of probe marks in a probe mark transfer member is disclosed in Japanese Patent Application Laid-Open No. 2009-198407. An inspection with measurement probes held against a transparent flat plate made of glass is disclosed in Japanese Patent Application Laid-Open No. 5-157790 (1993).

However, the evaluation method disclosed in Japanese Patent Application Laid-Open No. 2001-189353 presents problems in requiring the regeneration process of the deformable body each time the probe inspection is made and in requiring time for the inspection because the observation is made after transfer. Also, the apparatus and method disclosed in Japanese Patent Application Laid-Open No. 2001-189353 cannot be easily added to a conventional evaluation apparatus.

The probe mark transfer member disclosed in Japanese Patent Application Laid-Open No. 2009-198407 is described as recovered in a short time, but requires the regeneration process as well to present a problem in requiring time for the inspection because the observation is made after the transfer. The apparatus disclosed in Japanese Patent Application Laid-Open No. 5-157790 (1993) presents a problem such that the inspection accuracy is lowered because of disturbances such as illumination and background.

SUMMARY OF THE INVENTION

It is therefore an object of the present invention to provide a probe position inspection apparatus capable of inspecting the position of contact portions of respective probe tips easily and accurately.

According to the present invention, a probe position inspection apparatus includes a transparent plate, a camera, and a pressure passive member. The camera takes an image of one surface of the transparent plate. The pressure passive member covers the other surface of the transparent plate. The tip of the probe for use in evaluation of a semiconductor device is pressed against the other surface of the transparent plate, with the pressure passive member therebetween. The probe position inspection apparatus further includes an image processor. The image processor processes the image taken by the camera to detect the position of the probe in the plane of the transparent plate.

The probe position inspection apparatus eliminates the need for the conventional replacement of a probe mark transfer member for each inspection to improve convenience. The probe position inspection apparatus also eliminates the need for the conventional waiting of the recovery of a deformable body to improve the time efficiency of the inspection. Therefore, the probe position inspection apparatus is capable of detecting the position of the probes easily and accurately.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Configuration of Semiconductor Device Inspection Apparatus>

Figure 1:
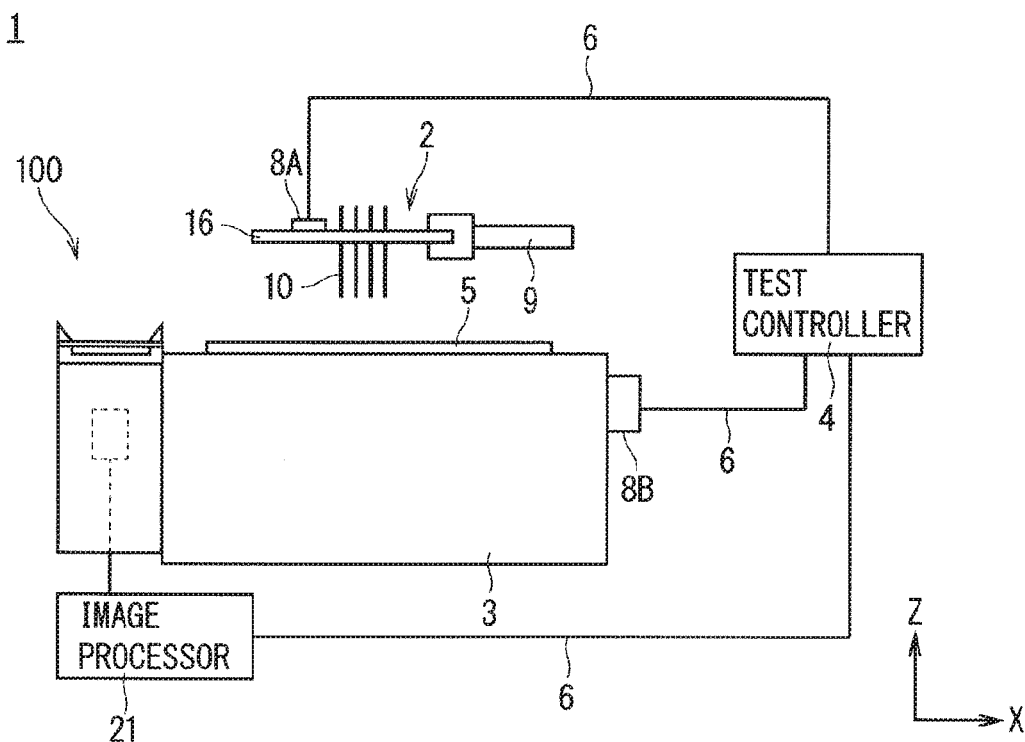
FIG. 1 is a diagram showing the configuration of a semiconductor device inspection apparatus according to a first preferred embodiment of the present invention.

FIG. 1 is a diagram showing the configuration of a semiconductor device inspection apparatus 1 according to a first preferred embodiment of the present invention. The semiconductor device inspection apparatus 1 according to the first preferred embodiment inspects the position of probes by means of a probe position inspection apparatus 100 (FIG. 2) before performing an electrical evaluation of a semiconductor device 5.

The semiconductor device inspection apparatus 1 includes a chuck stage 3, a test controller 4, a probe base body 2, and the probe position inspection apparatus 100. The chuck stage 3 has the function of vacuum suction as a means for fixing the semiconductor device 5. The means for fixing the semiconductor device 5 is not limited to vacuum suction but may be electrostatic suction, for example.

The probe base body 2 includes an insulative base body 16, a plurality of probes 10, and a connecting portion 8A. The probe base body 2 is held by a movable arm 9. The movable arm 9 is capable of moving the probe base body 2 to any position. The probe base body 2 is held by the single movable arm 9 in this case. However, the present invention is not limited to this. The probe base body 2 may be held by a plurality of movable arms with stability. The semiconductor device inspection apparatus 1 may be configured to move the chuck stage 3 in place of moving the probe base body 2.

The test controller 4 is electrically connected to a connecting portion 8B of the chuck stage 3 and to the connecting portion 8A of the probe base body 2 through signal lines 6.

An example of the semiconductor device 5 placed and fixed h chuck stage 3 includes a semiconductor wafer. For example, semiconductor elements having a vertical structure are formed on the semiconductor wafer. A semiconductor element having a vertical structure refers to a semiconductor element including main electrodes formed on the from and back surfaces of the semiconductor wafer. Semiconductor elements having a lateral structure may be formed on the semiconductor wafer. A semiconductor element having a lateral structure refers to a semiconductor element including main electrodes formed on one of the surfaces of the semiconductor wafer. When a test is conducted on the semiconductor device 5, the electrode on the front surface of the semiconductor device 5 contacts the probes 10. The electrode on the back surface of the semiconductor device 5 contacts the upper surface of the chuck stage 3.

On the assumption that large current (for example, 5 A or higher) is applied to the probes 10, the probes 10 are provided for the individual semiconductor elements formed on the semiconductor wafer. Although not shown, a metal plate provided on the insulative base body 16, for example, establishes an electrical connection between the probes 10 and the connecting portion 8A.

In this case, it is preferable that distances from the connecting portion 8A to the respective probes 10 are approximately equal to each other so that the densities of current applied to the respective probes 10 are approximately equal to each other. Likewise, it is preferable that distances from the connecting portion 8B via the chuck stage 3 to the respective probes 10 are approximately equal to each other. That is, it is desirable that the connecting portion 8A and the connecting portion 8B are positioned in opposed relation to each other, with the probes 10 therebetween.

Figure 3:
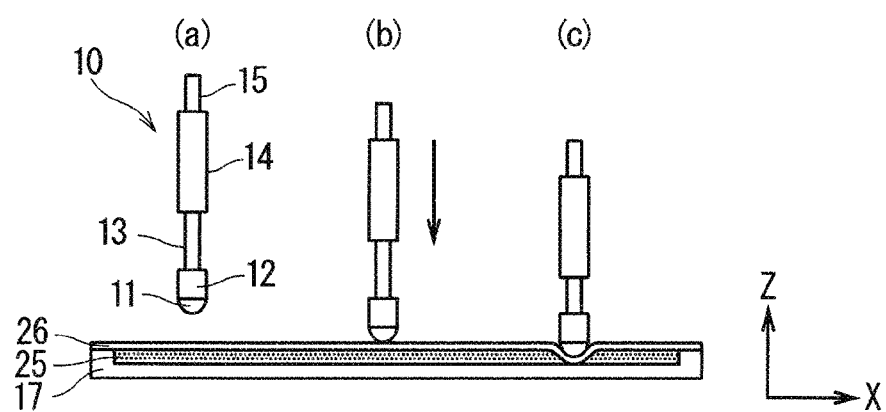
FIG. 3 is a view illustrating the configuration of a transparent plate and its surroundings in the probe position inspection apparatus and the contacting operation of a probe according to the first preferred embodiment.

Part (a) in FIG. 3 shows the structure of such a probe 10. The probe 10 includes a barrel portion 14, a contact portion 11, a plunger portion 12 having a push-in portion 13, and an electrically connecting portion 15. The barrel portion 14 is fixed to the insulative base body 16. The contact portion 11 makes mechanical and electrical contact with the electrode provided on the front surface of the semiconductor device 5. A spring member such as a spring is incorporated in the push-in portion 13. When the contact portion 11 receives pressure in an upward direction (in the Z-axis direction of FIG. 3), the push-in portion 13 slides in such a direction as to be pushed into the barrel portion 14. The electrically connecting portion 15 is electrically connected to the contact portion 11 at the tip of the probe 10. The electrically connecting portion 15 is also electrically connected to the connecting portion 8A.

The probe 10 is made of a metal material having electrical conductivity, such as copper, tungsten, and rhenium tungsten. However, the material of the probe 10 is not limited to this. In particular, the contact portion 11 may be covered with a different material such as gold, palladium, tantalum, and platinum from the viewpoints of improvements in electrical conductivity and in durability.

The probe 10 is described as incorporating the spring member slidable in the Z-axis direction. However, the probe 10 is not limited to this. The probe 10 may include a spring member provided outside the probe 10. This mechanism of the probe 10 is not limited to such a spring type but may be a cantilever type. Also, the probe 10 may be a laminated probe, a wire probe or the like.

The test controller 4 is implemented by a processing circuit not shown. The processing circuit may be a CPU (known also as a central processing unit, a processing unit, an arithmetic unit, a microprocessor, a microcomputer, a processor, and a DSP) which executes programs stored in a memory.

When the processing circuit is purpose-built hardware, examples of the processing circuit include a single circuit, a composite circuit, a programmed processor, a concurrently programmed processor, an ASIC, an FPGA, and a combination thereof.

When the processing circuit is a CPU, the processing circuit reads the programs stored in the memory to execute the programs, thereby implementing the aforementioned operations. Examples of the memory used herein include nonvolatile and volatile semiconductor memories such as a RAM, a. ROM, a flash memory, an EPROM, and an EEPROM; a magnetic disk; a flexible disk; an optical disk; a compact disk, a minidisk; and a DVD.

Some of the operations of the processing circuit may be implemented by purpose-built hardware, whereas the remainder is implemented by software or firmware.

In this manner, the processing circuit is capable of implementing the aforementioned operations by means of hardware, software, firmware, and a combination thereof.

<Configuration of Probe Position Inspection Apparatus>

Figure 2:
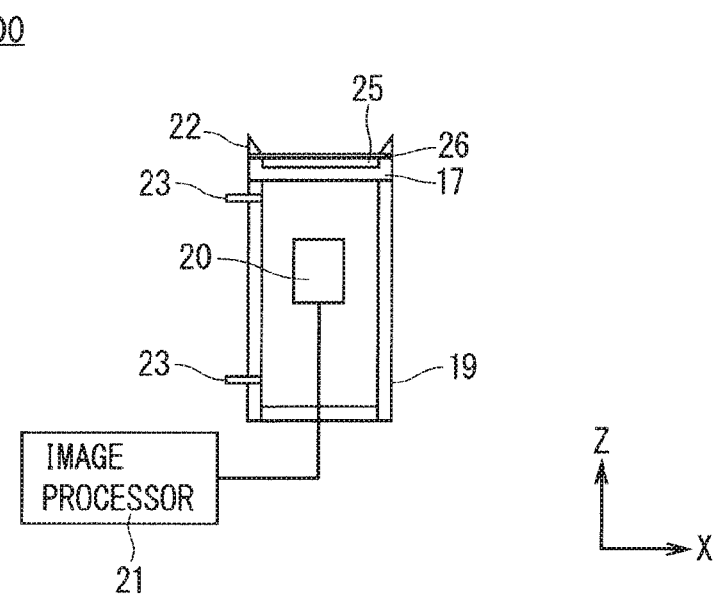
FIG. 2 is a schematic sectional view of a probe position inspection apparatus according to the first preferred embodiment.

FIG. 2 is a schematic sectional view of the probe position inspection apparatus 100 according to the first preferred embodiment. The probe position inspection apparatus 100 includes a transparent plate 17, a camera 20, an image processor 21, and a pressure passive member 25.

The pressure passive member 25 is disposed in such a manner as to cover a surface of the transparent plate 17 which faces in the Z direction. The transparent plate 17 is in the shape of a tray, and the pressure passive member 25 is disposed in the tray of the transparent plate 17. As shown in FIG. 3, the tray of the transparent plate 17 is covered with a sealing member 26 serving as a lid. That is, the sealing member 26 seals the pressure passive member 25 between the sealing member 26 and the transparent plate 17.

In the first preferred embodiment, the transparent plate 17 is disposed near the chuck stage 3, e.g. in adjacent relation to the chuck stage 3 as shown in FIG. 1.

The probes 10 are pressed against the transparent plate 17. Thus, the transparent plate 17 is required to be strong enough to withstand the pressing of the probes 10. The transparent plate 17 is also required to be transparent because the tips of the probes 10 are photographed with the camera 20 through the transparent plate 17. To meet the aforementioned requirements, the transparent plate 17 is a transparent glass plate having a thickness of several millimeters. The transparent plate 17 may be made of other materials satisfying the aforementioned requirements.

An anti-reflection coating may be provided on a photographing surface (surface facing in the negative Z direction) of the transparent plate 17 to reduce disturbance factors during photographing. The anti-reflection coating is formed, for example, by affixing an anti-reflection film to the photographing surface of the transparent plate 17.

The pressure passive member 25 is made of a material flowable and soft enough to be displaced by the probes 10 when the probes 10 come in contact with the pressure passive member 25. It is necessary that the pressure passive member 25 is colored so that a distinction is made between a region where the pressure passive member 25 is present and a region where the pressure passive member 25 is displaced and hence absent, based on the colors. The pressure passive member 25 has resilience that is the ability to return to its original shape or position after the probes 10 are moved out of contact with the pressure passive member 25. For this reason, a colored liquid such as an antifreeze solution, for example, is used as the pressure passive member 25 in the first preferred embodiment. The pressure passive member 25 is not limited to this so long as the material of the pressure passive member 25 satisfies the aforementioned conditions of flowability, softness, resilience and color.

The sealing member 26 functions to seal the pressure passive member 25. An anti-reflection coating may be provided on a photographing surface (surface facing toward the transparent plate 17) of the sealing member 26 to reduce disturbance factors during photographing. The anti-reflection coating is formed, for example, by affixing an anti-reflection film to the photographing surface of the sealing member 26. It is preferable that the sealing member 26 is made of a material softer than that of the tips of the probes 10 for the purpose of protecting the tips (contact portions 11) of the probes 10. A flexible easy-to-replace sheet material is preferably used as the sealing member 26. An example of the sealing member 26 includes, but not limited to, a PVC (polyvinyl chloride) sheet.

The camera 20 takes an image of a surface of the transparent plate 17 which is opposite from the surface thereof against which the probes 10 are pressed. An example of the camera 20 includes a CCD (charge-coupled device) camera. The camera 20 in the first preferred embodiment is housed in an enclosure 19 from the viewpoint of stability of photographing environments.

In the probe position inspection apparatus 100 according to the first preferred embodiment, an illuminator 22 is provided on the probe contact surface side of the transparent plate 17. The illuminator 22 emits light toward the probes 10. The) illuminator 22 is provided for purposes of stabilization of photographing conditions. For the stabilization, it is desirable that illuminators 22 are provided at a plurality of locations. An example of a light source for the illuminator 22 used herein include an LED light source which generates less heat and is longer in life than an incandescent lamp. However, the light source for the illuminator 22 is not limited to the LED light source.

Dry air may be circulated in the enclosure 19 to avoid water condensation on the camera 20, especially on the lens of the camera 20, from the viewpoint of stability of photographing environments. In this case, two dry air circulation ports 23 are provided, for example, in a side surface of the enclosure 19, so that dry air flows into the enclosure 19 through one of the dry air circulation ports 23 and air is exhausted from the enclosure 19 through the other dry air circulation port 23.

The inner wall of the enclosure 19 may be painted black for the purpose of reducing disturbance factors during photographing. Alternatively, an anti-reflection coating may be provided on the inner wall of the enclosure 19 for the purpose of reducing disturbance factors during photographing. The anti-reflection coating is formed, for example, by affixing an anti-reflection film to the inner wall of the enclosure 19.

The image processor 21 is implemented by a processing circuit, not shown. The processing circuit may be a CPU which executes programs stored in a memory.

When the processing circuit is purpose-built hardware, examples of the processing circuit include a single circuit, a composite circuit, a programmed processor, a concurrently programmed processor, an ASIC, an FPGA, and a combination thereof.

When the processing circuit is a CPU, the processing circuit reads the programs stored in the memory to execute the programs, thereby implementing the aforementioned operations. Examples of the memory used herein include nonvolatile and volatile semiconductor memories such as a RAM, a ROM, a flash memory, an EPROM, and an EEPROM; a magnetic disk; a flexible disk; an optical disk; a compact disk, a minidisk; and a DVD.

Some of the operations of the processing circuit may be implemented by purpose-built hardware, whereas the remainder is implemented by software or firmware. In this manner, the processing circuit is capable of implementing the aforementioned operations by means of hardware, software, firmware, and a combination thereof.

<Operation>

The electrical evaluation of the semiconductor device 5 is performed by pressing the probes 10 against the electrode provided on the front surface of the semiconductor device 5. Like the actual evaluation of the semiconductor device 5, the inspection of the probe position is made in such a condition that the probes 10 are pressed against the transparent plate 17, i.e. in a condition similar to that for the actual evaluation. This is because it is important to grasp the probe position in the actual evaluation of the semiconductor device 5.

Figure 5:
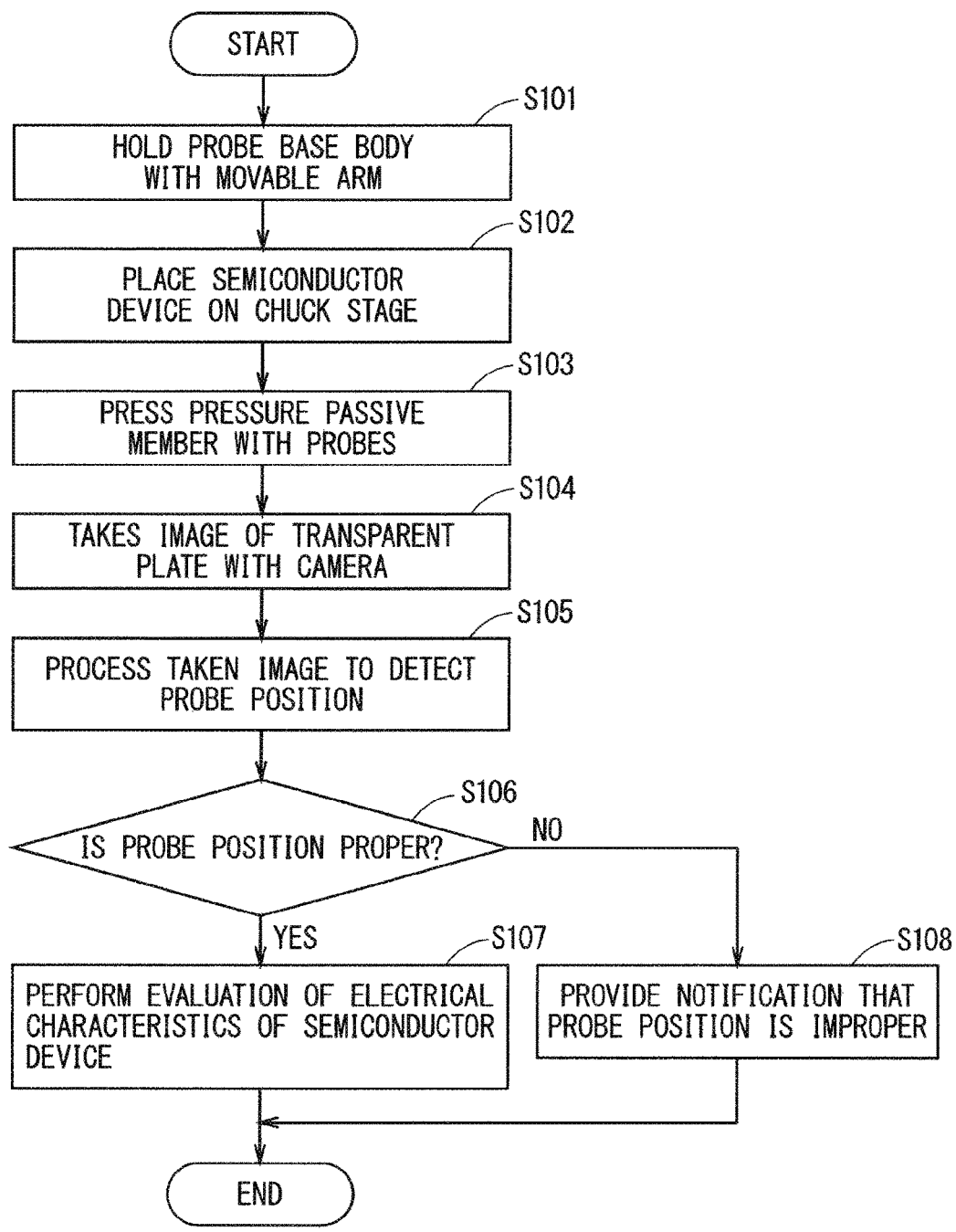
FIG. 5 is a flow diagram showing the operations of the probe position inspection apparatus and the semiconductor device inspection apparatus according to the first preferred embodiment.

The operations of the semiconductor device inspection apparatus 1 and the probe position inspection apparatus 100 according to the first preferred embodiment will be described. FIG. 5 is a flow diagram showing the operations of the semiconductor device inspection apparatus 1 and the probe position inspection apparatus 100.

First, the probe base body 2 is prepared. The probes 10 corresponding to the electrode of the semiconductor device 5 yet to be inspected are disposed in the probe base body 2. The probe base body 2 is held by the movable arm 9 (Step S101). At this time, the connecting portion 8A of the probe base body 2 is electrically connected to the test controller 4.

Next, the semiconductor device 5 to be inspected is placed on the chuck stage 3 (Step S102). At this time, the semiconductor device 5 is fixed on the chuck stage 3 by vacuum suction and the like to come in electrical contact with the chuck stage 3. The semiconductor device 5 used herein is, for example, a semiconductor wafer including a plurality of semiconductor chips formed thereon. Alternatively, the semiconductor device 5 may be a semiconductor chip itself. This step (Step S102) may be performed immediately before the step (Step S107) of performing the evaluation of the electrical characteristics of the semiconductor device 5 to be described later (i.e., between Steps S106 and S107).

Figure 4:
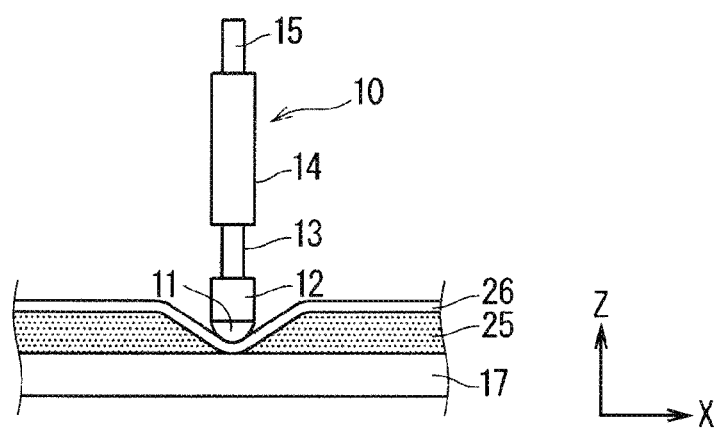
FIG. 4 is a view of a probe pressing a pressure passive member in the probe position inspection apparatus according to the first preferred embodiment.

Next, the test controller 4 controls the movable arm 9 to move the probe base body 2 to over the transparent plate 17 (part (a) in FIG. 3). Then the test controller 4 causes the probe base body 2 to move downwardly, thereby bringing the contact portion 11 of each of the probes 10 into contact with the sealing member 26 (part (b) in FIG. 3). When the test controller 4 causes the probe base body 2 to move further downwardly, the push-in portion 13 is pushed into the barrel portion 14 via the spring member, and the contact portion 11 of each probe 10 presses the pressure passive member 25, with the sealing member 26 therebetween, as shown in part (e) in FIG. 3 (Step S103). FIG. 4 is an enlarged view of part (c) in FIG. 3. At this time, the pressure passive member 25 is displaced and hence absent in the area with which each probe 10 is in contact, as shown in FIG. 4. The load imposed on each probe 10 when each probe 10 is pressed against the pressure passive member 25 is made equal to the load imposed on each probe 10 when each probe 10 is brought into contact with the semiconductor device 5.

Then, with the probes 10 pressed against the pressure passive member 25, the camera 20 takes an image of the surface of the transparent plate 17 which is opposite from the pressure passive member 25 (Step S104).

Next, the image processor 21 processes the image taken by the camera 20 to detect the position of the probes 10 in the plane of the transparent plate 17 (Step S105). Then, the image processor 21 judges whether the probe position is proper or not (Step S106).

It is assumed, for example, that the position of 16 probes 10 arranged equidistantly in a four-by-four matrix is a proper probe position (i.e. a previously determined probe position).

Figure 6:
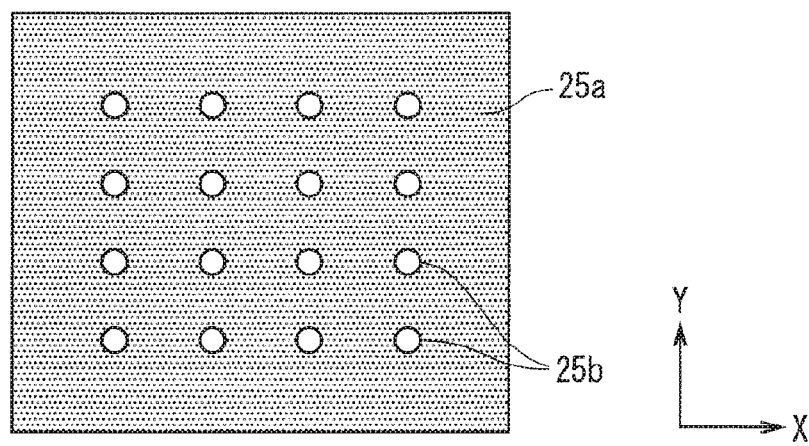
FIGS. 6 and 7 are views of examples of images taken by a camera in the probe position inspection apparatus according to the first preferred embodiment.
Figure 7:
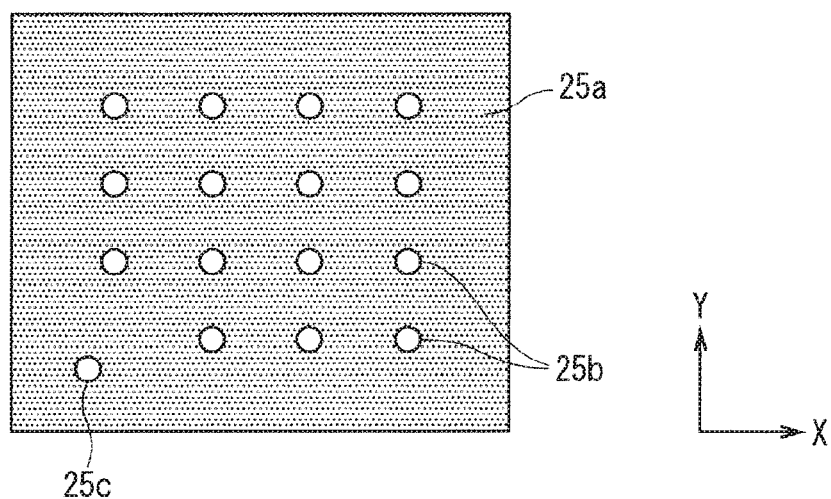

FIGS. 6 and 7 show examples of the images taken by the camera 20. As shown in FIGS. 6 and 7, a region 25a in which the pressure passive member 25 is present on the transparent plate 17 includes pixels having the color of the pressure passive member 25. On the other hand, regions 25b in which the probes 10 are pressed against the transparent plate 17 include pixels different in color from those in the region 25a because the pressure passive member 25 is displaced and hence absent in the regions 25b. The image processor 21 performs image processing which senses the difference in color to detect the position of the probes 10 in the plane of the transparent plate 17.

Referring to FIG. 6, pixels different in color from those in the region 25a are arranged equidistantly in a four-by-four matrix. Specifically, when the image taken by the camera 20 is that shown in FIG. 6, the image processor 21 judges that the position of the probes 10 is proper. In this case, the image processor 21 notifies the test controller 4 that the probe position is proper. Then, the test controller 4 performs the evaluation of the electrical characteristics of the semiconductor device 5 through the use of the probes 10 disposed in the probe base body 2 (Step S107).

Referring to FIG. 7, a region 25c at the lower left is out of an array of the regions 25b in the form of the four-by-four regular matrix. This means that the position of one of the probes 10 which corresponds to the region 25c is not its intended position. When the image taken by the camera 20 is that shown in FIG. 7, the image processor 21 judges that the position of the probes 10 is not proper. In this case, the image processor 21 notifies the test controller 4 that the probe position is not proper (Step S108). Then, the test controller 4 stops performing the evaluation of the electrical characteristics of the semiconductor device 5. The test controller 4 issues an alarm to a user, for example, to notify the user that the performance of the evaluation of the electrical characteristics of the semiconductor device 5 is stopped. In addition, the test controller 4 may use voice or sound to notify the user that the position of the probes 10 is not proper. The user who receives the notification makes a check, a replacement and the like of the probes 10.

The inspection of the probe position is made for each semiconductor device 5 to be evaluated. Alternatively, the inspection of the probe position may be made with a determined fixed frequency (for example, each time the inspection of a previously determined number of semiconductor devices 5 is finished).

<Effects>

The probe position inspection apparatus 100 according to the first preferred embodiment includes the transparent plate 17, the camera 20 for taking an image of one surface of the transparent plate 17, and the pressure passive member 25 covering the other surface of the transparent plate 17. The tip of the probe 10 used for evaluation of the semiconductor device 5 is pressed against the other surface of the transparent plate 17, with the pressure passive member 25 therebetween. The probe position inspection apparatus 100 according to the first preferred embodiment further includes the image processor 21 for processing the image taken by the camera 20 to detect the position of the probe 10 in the plane of the transparent plate 17.

The probe position inspection apparatus 100 according to the first preferred embodiment detects the position of the probes 10 by taking the image of the pressure passive member 25 against which the probes 10 are pressed through the transparent plate 17. That is, the probe position inspection apparatus 100 according to the first preferred embodiment eliminates the need for the conventional replacement of a probe mark transfer member for each inspection to improve convenience. The probe position inspection apparatus 100 according to the first preferred embodiment also eliminates the need for the conventional waiting of the recovery of a deformable body to improve the time efficiency of the inspection. Thus, the probe position inspection apparatus 100 according to the first preferred embodiment is capable of detecting the position of the probes 10 easily and accurately. The probe position inspection apparatus 100 according to the first preferred embodiment may be used alone, but may be easily added to the conventional semiconductor device inspection apparatus 1. The combination of the probe position inspection apparatus 100 according to the first preferred embodiment with the semiconductor device inspection apparatus 1 achieves the inspection of the semiconductor device 5 with higher accuracy.

In the probe position inspection apparatus 100 according to the first preferred embodiment, the pressure passive member 25 is made of a colored soft material.

The use of the soft material for the pressure passive member 25 allows the probes 10 to dig into part of the pressure passive member 25 with which the probes 10 come into contact, thereby displacing the part of the pressure passive member 25. The use of the colored pressure passive member 25 allows a distinction between the region where the pressure passive member 25 is present and the region where the pressure passive member 25 is absent (i.e., displaced by the probes 10), based on the colors. Also, the use of the colored pressure passive member 25 avoids the appearance of disturbance factors (background) within an image taken by the camera 20 during photographing.

The probe position inspection apparatus 100 according to the first preferred embodiment further includes the sealing member 26 which seals the pressure passive member 25 between the sealing member 26 and the other surface of the transparent plate 17 (the surface where the pressure passive member 25 is disposed).

Thus, sealing the pressure passive member 25 between the sealing member 26 and the transparent plate 17 prevents the pressure passive member 25 from flowing outwardly of the transparent plate 17. This allows the pressure passive member 25 to be held on the transparent plate 17 with stability. The provision of the sealing member 26 prevents the probes 10 from directly contacting the transparent plate 17 to protect the transparent plate 17.

In the probe position inspection apparatus 100 according to the first preferred embodiment, the camera 20 is provided inside the enclosure 19.

Housing the camera 20 inside the enclosure 19 suppresses the adhesion and the like of dust and foreign matter to the lens of the camera 20. This improves the detection accuracy of the probe position.

The semiconductor device inspection apparatus 1 according to the first preferred embodiment includes the probe position inspection apparatus 100, the chuck stage 3 for placing the semiconductor device 5 thereon, the probe 10 coining into contact with the semiconductor device 5, and the test controller 4 for sending and receiving signals to and from the probe 10 to thereby evaluate the electrical characteristics of the semiconductor device 5 placed on the upper surface of the chuck stage 3. The transparent plate 17 of the probe position inspection apparatus 100 is disposed near the chuck stage 3.

Thus, the incorporation of the probe position inspection apparatus 100 into the semiconductor device inspection apparatus 1 allows the inspection of the probe position to be made before the inspection of the semiconductor device 5. This prevents the inspection of the semiconductor device 5 from being made when the position of the probes 10 remains improper, to achieve the inspection of the semiconductor device 5 with high accuracy and with high reliability.

Also, the placement of the transparent plate 17 of the probe position inspection apparatus 100 near the chuck stage 3 reduces the distance of movement of the probes 10 between the chuck stage 3 and the transparent plate 17. This improves the time efficiency during the inspection of the probe position. The reduced distance of movement makes it easy to use the probe position inspection apparatus 100 in the existing semiconductor device inspection apparatus.

The method of inspecting the semiconductor device 5 according to the first preferred embodiment is a method which uses the semiconductor device inspection apparatus 1 to inspect the semiconductor device 5. The method includes: (a) taking an image of the one surface of the transparent plate 17 by means of the camera 20, with the pressure passive member 25 pressed by the probe 10; (h) processing the image taken by the camera 20 to detect the position of the probe 10, thereby judging whether the position of the probe 10 coincides with a previously determined position or not, the (b) being performed by the image processor 21; and (c) determining whether to perform an evaluation of electrical characteristics of the semiconductor device 5 or not, based on the result of judgement of the image processor 21, the (c) being performed by the test controller 4.

In the (a), the camera takes an image of the pressure passive member 25 against which the probes 10 are pressed through the transparent plate 17. In the (b), the image processor 21 detects the position of the probes 10 to judge whether position of the probes 10 coincides with the previously determined position or not (i.e., whether the probe position is proper or not). In the (c), the test controller 4 determines whether to perform an evaluation of electrical characteristics of the semiconductor device 5 or not, based on the result of judgement of the image processor 21. Thus, the inspection of the probe position is made before the inspection of the semiconductor device 5. This prevents the inspection of the semiconductor device 5 from being made when the position of the probes 10 remains improper, to achieve the inspection of the semiconductor device 5 with high accuracy and with high reliability.

Modification of First Preferred Embodiment

Figure 8:
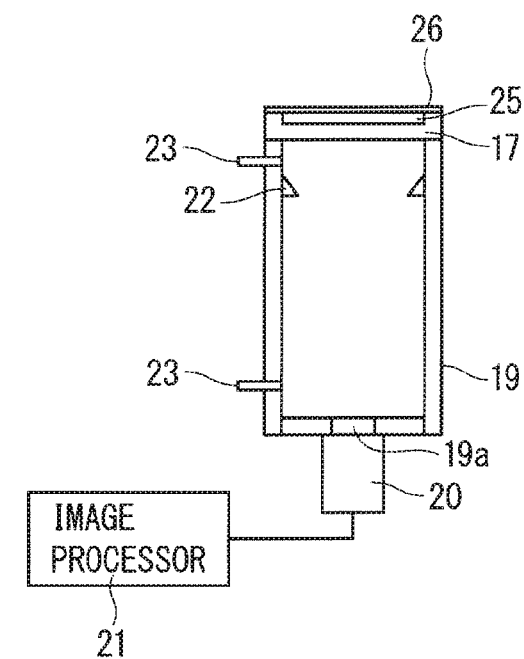
FIG. 8 is a schematic sectional view of a probe position inspection apparatus according to a modification of the first preferred embodiment.

FIG. 8 is a schematic sectional view of a probe position inspection apparatus 100A according to a modification of the first preferred embodiment. The configuration of the semiconductor device inspection apparatus according to this modification is similar to that according to the first preferred embodiment (FIG. 1), and will not be described.

In this modification, the sealing member 26 is a non-transparent member. In this case, the illuminator 22 is provided inside the enclosure 19, rather than outside the enclosure 19. The illuminator 22 is disposed on the inner wall of the enclosure 19 so as to illuminate the imaging surface (the surface the image of which is taken by the camera 20) of the transparent plate 17.

In the first preferred embodiment, the probe position inspection apparatus 100 is configured such that the camera 20 is housed inside the enclosure 19 from the viewpoint of stability of photographing environments. In this modification, on the other hand, an imaging hole 19a is provided in the bottom surface of the enclosure 19. Then, the camera 20 is disposed outside the bottom surface of the enclosure 19.

The camera 20 takes an image of the imaging surface of the transparent plate 17 through the imaging hole 19a.

<Effects>

The probe position inspection apparatus 100A according to the modification of the first preferred embodiment further includes the illuminator 22 which irradiates one of the surfaces of the transparent plate 17 (i.e., the imaging surface or the surface opposite from the surface on which the pressure passive member 25 is disposed) with light. When the seating member 26 which seals the pressure passive member 25 is the non-transparent member, the illuminator 22 is provided on the opposite side of the transparent plate 17 from the surface on which the pressure passive member 25 is disposed, to thereby illuminate the imaging surface of the transparent plate 17. By illuminating the imaging surface of the transparent plate 17, the detection accuracy of the probe position is improved.

In the probe position inspection apparatus 100A according to the modification of the first preferred embodiment, the illuminator 22 is provided inside the enclosure 19. The provision of the illuminator 22 inside the enclosure 19 achieves the incorporation of the illuminator 22 into the enclosure 19. The integration of the enclosure 19 and the illuminator 22 makes it easy to place the probe position inspection apparatus 100A in combination with the conventional semiconductor device inspection apparatus, thereby improving convenience. The provision of the illuminator 22 inside the enclosure 19 also makes tight from the illuminator 22 less prone to leak outwardly of the enclosure 19, thereby improving light irradiation efficiency.

In the probe position inspection apparatus 100A according to the modification of the first preferred embodiment, the camera 20 is provided outside the enclosure 19. The provision of the camera 20 outside the enclosure 19 facilitates the operation of the camera 20 to improve the ease of maintenance.

Second Preferred Embodiment

<Configuration>

Figure 9:
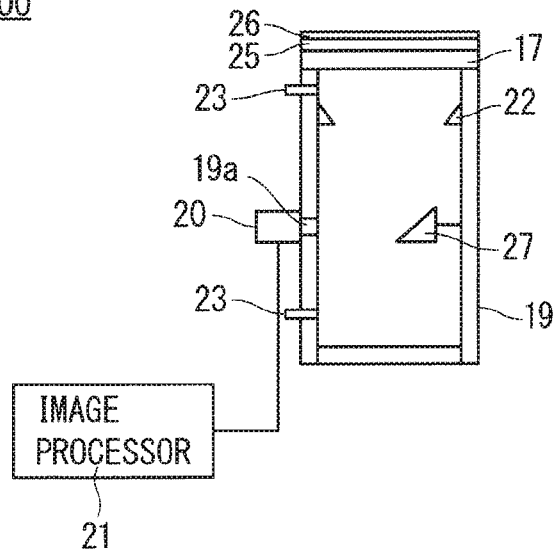
FIG. 9 is a schematic sectional view of a probe position inspection apparatus according to a second preferred embodiment of the present invention.

FIG. 9 is a schematic sectional view of a probe position inspection apparatus 200 according to a second preferred embodiment of the present invention. The configuration of the semiconductor device inspection apparatus according to the second preferred embodiment is similar to that according to the first preferred embodiment (FIG. 1), and will not be described.

In the second preferred embodiment, the pressure passive member 25 is made of a piezochromic light-emitting material. The piezochromic light-emitting material refers to a material which produces a light-emitting change when pressure is applied thereto. An example of the piezochromic light-emitting material includes, but not limited to, a material having a fluorescent perylene ring.

In the second preferred embodiment, the sealing member 26 is a transparent member. As in the first preferred embodiment, it is preferable that the sealing member 26 is made of a material softer than that of the tips of the probes 10 for the purpose of protecting the tips (contact portions 11) of the probes 10. The provision of the sealing member 26 prevents the tips of the probes 10 from directly contacting the transparent plate 17 to protect the transparent plate 17.

A flexible easy-to-replace sheet material is preferably used as the sealing member 26. An example of the sealing member 26 includes, but not limited to, a polyvinyl chloride sheet.

In the case of the breakage of the sealing member 26 because of fatigue resulting from the contact of the probes 10, only the sealing member 26 may be replaced, and the pressure passive member 25 (piezochromic light-emitting material) and the transparent plate 17 need not be replaced.

In the second preferred embodiment, the imaging hole 19a is provided in a side surface of the enclosure 19. Then, the camera 20 is disposed outside the side surface of the enclosure 19. In the second preferred embodiment, a prism 27 is disposed inside the enclosure 19. The prism 27 is disposed so as to direct the image of the imaging surface of the transparent plate 17 toward the imaging hole 19a. The camera 20 takes the image of the imaging surface of the transparent plate 17 through the imaging hole 19a via the prism 27.

The camera 20 in the second preferred embodiment is a CCD camera, as in the first preferred embodiment. The illuminator 22 is disposed inside the enclosure 19 in the second preferred embodiment, but may be disposed outside the enclosure 19 in accordance with photographing environments and the like, as in the first preferred embodiment. The remaining configuration of the probe position inspection apparatus 200 is similar to that according to the first preferred embodiment (FIG. 2), and will not be described.

<Operation>

The steps of operation of the probe position inspection apparatus 200 according to the second preferred embodiment are similar to those according to the first preferred embodiment except the operation of pressing the probes 10 against the pressure passive member 25.

In the first preferred embodiment, the probes 10 are pressed against the pressure passive member 25 so that the tips of the probes 10 displace the pressure passive member 25, as shown in FIG. 4.

Figure 10A:
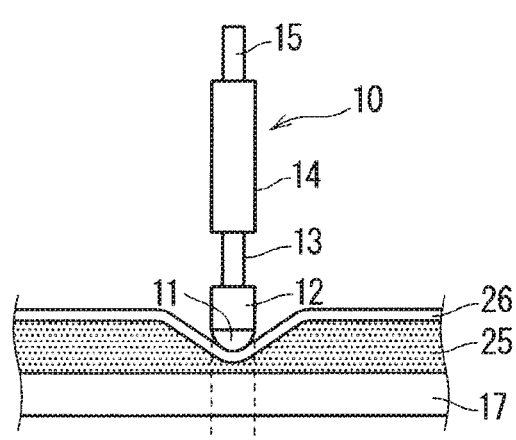
FIGS. 10A and 10B are views of the probe pressing the pressure passive member in the probe position inspection apparatus according to the second preferred embodiment.
Figure 10B:
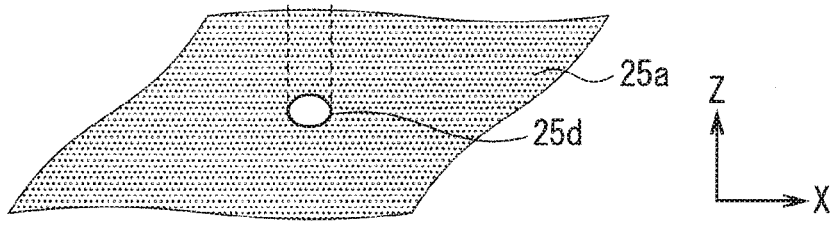

In the second preferred embodiment, on the other hand, the probes 10 are pressed against the pressure passive member 25 so as not to completely displace the pressure passive member 25, as shown in FIG. 10A. The light emission in a region of the pressure passive member 25 to which the probes 10 apply pressure is changed in the second preferred embodiment. Thus, as shown in FIG. 10B, the color of a region 25d pressed by the probe 10 appears different from that of the surrounding region 25a in the image taken by the camera 20. The image processor 21 uses this difference in color to detect the position of the probes 10, as in the first preferred embodiment.

<Effects>

In the probe position inspection apparatus 200 according to the second preferred embodiment, the pressure passive member 25 is made of a piezochromic light-emitting material which emits light when pressure is applied thereto.

The use of the piezochromic light-emitting material for the pressure passive member 25 allows a distinction between the region where pressure is applied to the pressure passive member 25 and the region where pressure is not applied to the pressure passive member 25, based on the presence/absence of light emission and the colors. Thus, the pressing of the probes 10 against the pressure passive member 25 achieves the detection of the position of the probes 10 through the use of the light emission depending on the application of pressure.

The probe position inspection apparatus 200 according to the second preferred embodiment further includes the prism 27 disposed inside the enclosure 19. The camera 20 is provided outside the enclosure 19, and takes an image of the one surface of the transparent plate 17 via the prism 27.

The configuration in which the prism 27 is disposed inside the enclosure 19 and the camera 20 takes an image via the prism 27 increases the flexibility of the position where the camera 20 is placed. The provision of the prism 27 in the second preferred embodiment allows the camera 20 to be placed on a side surface of the enclosure 19. The provision of the camera 20 on the side surface of the enclosure 19 facilitates the connection to the image processor 21 to improve workability. The provision of the camera 20 outside the enclosure 19 facilitates the operation of the camera 20 to improve the ease of maintenance.

The sealing member 26 is made of a material softer than that of the tip of the probe 10 in the probe position inspection apparatuses 100, 100A and 200 according to the first preferred embodiment, the modification of the first preferred embodiment and the second preferred embodiment. This allows the protection of the tip (contact portion 11) of the probe 10.

An anti-reflection coating may be provided on the surface of the sealing member 26 which is closer to the pressure passive ember 25 in the probe position inspection apparatuses 100, 100A and 200 according to the first preferred embodiment, the modification of the first preferred embodiment and the second preferred embodiment.

This suppresses disturbance of an image taken by the camera 20 because of light reflection from the sealing member 26. Thus, the detection accuracy of the probe position is improved.

The anti-reflection coating provided on the surface of the sealing member 26 which is closer to the pressure passive member 25 may be an anti-reflection in the probe position inspection apparatuses 100, 100A and 200 according to the first preferred embodiment, the modification of the first preferred embodiment and the second preferred embodiment. The anti-reflection coating is formed easily by affixing the anti-reflection film to the surface of the sealing member 26.

The probe position inspection apparatuses 100, 100A and 200 according to the first preferred embodiment, the modification of the first preferred embodiment and the second preferred embodiment further include the enclosure 19 which houses one of the surfaces of the transparent plate 17 (the surface the image of which is taken by the camera 20).

Housing the surface of the transparent plate 17 the image of which is taken by the camera 20 inside the enclosure 19 suppresses the adhesion and the like of dust and foreign matter to the transparent plate 17. This improves the detection accuracy of the probe position.

The enclosure 19 may have a black inner wall in the probe position inspection apparatuses 100, 100A and 200 according to the first preferred embodiment, the modification of the first preferred embodiment and the second preferred embodiment.

The black inner wall of the enclosure 19 suppresses the reflection of light from the inner wall to suppress disturbance of an image taken by the camera 20. This improves the detection accuracy of the probe position.

An anti-reflection coating may be provided on the inner wall of the enclosure 19 in the probe position inspection apparatuses 100, 100A and 200 according to the first preferred embodiment, the modification of the first preferred embodiment and the second preferred embodiment.

This suppresses disturbance of an image taken by the camera 20 because of light reflection from the inner wall of the enclosure 19. Thus, the detection accuracy of the probe position is improved.

The anti-reflection coating provided on the inner wall of the enclosure 19 may be an anti-reflection film in the probe position inspection apparatuses 100, 100A and 200 according to the first preferred embodiment, the modification of the first preferred embodiment and the second preferred embodiment. The anti-reflection coating is formed easily by affixing the anti-reflection film to the inner wall of the enclosure 19.

The probe position inspection apparatuses 100, 100A and 200 according to the first preferred embodiment, the modification of the first preferred embodiment and the second preferred embodiment further include the dry air circulation ports 23 which circulate dry air in the enclosure 19. The circulation of dry air in the enclosure 19 suppresses water condensation on the lens of the camera 20.

The preferred embodiments according to the present invention may be freely combined within the scope of the invention or the preferred embodiments may be changed and dispensed with, as appropriate.

While the invention has been described in detail, the foregoing description is in all aspects illustrative and not restrictive. It is understood that numerous other modifications and variations can be devised without departing from the scope of the invention.

What is claimed is:

1. A probe position inspection apparatus comprising:
   a transparent plate;
   a camera for taking an image of one surface of said transparent plate; and
   a pressure passive member covering the other surface, opposite to the one surface, of said transparent plate,
   wherein the tip of a probe for use in evaluation of a semiconductor device is pressed against said other surface of said transparent plate, with said pressure passive member therebetween,
   said probe position inspection apparatus further comprising
   an image processor for processing the image taken by said camera to detect the position of said probe in the plane of said transparent plate.

2. The probe position inspection apparatus according to claim 1, wherein
   said pressure passive member is made of a colored soft material.

3. The probe position inspection apparatus according to claim 1, wherein
   said pressure passive member is made of a piezochromic light-emitting material which emits light when pressure is applied thereto.

4. The probe position inspection apparatus according to claim 1, further comprising
   a sealing member sealing said pressure passive member between said sealing member and said other surface of said transparent plate.

5. The probe position inspection apparatus according to claim 4, wherein
   said sealing member is made of a material softer than that of the tip of the probe.

6. The probe position inspection apparatus according to claim 4, wherein
   an anti-reflection coating is provided on a surface of said sealing member which is closer to said pressure passive member.

7. The probe position inspection apparatus according to claim 6, wherein the anti-reflection coating provided on the surface of said sealing member which is closer to said pressure passive member is an anti-reflection film.

8. The probe position inspection apparatus according to claim 1, further comprising
an enclosure housing said one surface of said transparent plate.

9. The probe position inspection apparatus according to claim 8, further comprising
an illuminator for irradiating said one surface of said transparent plate with light.

10. The probe position inspection apparatus according to claim 8, wherein
said illuminator is provided inside said enclosure.

11. The probe position inspection apparatus according to claim 8, wherein
said camera is provided inside said enclosure.

12. The probe position inspection apparatus according to claim 8, wherein
said camera is provided outside said enclosure.

13. The probe position inspection apparatus according to claim 8, further comprising
a prism disposed inside said enclosure,
wherein said camera is provided outside said enclosure, and
wherein said camera takes the image of said one surface of said transparent plate via said prism.

14. The probe position inspection apparatus according to claim 8, wherein
said enclosure has a black inner wall.

15. The probe position inspection apparatus according to claim 8, wherein
an anti-reflection coating is provided on the inner wall of said enclosure.

16. The probe position inspection apparatus according to claim 15, wherein
the anti-reflection coating provided on the inner wall of said enclosure is an anti-reflection film.

17. The probe position inspection apparatus according to claim 8, further comprising
a dry air circulation port for circulating dry air in said enclosure.

18. An apparatus for inspecting a semiconductor device, comprising:
a probe position inspection apparatus as recited in claim 1;
a chuck stage for placing said semiconductor device thereon;
a probe coming into contact with said semiconductor device; and
a test controller for sending and receiving signals to and from said probe to thereby evaluate an electrical characteristic of said semiconductor device placed on the upper surface of said chuck stage,
wherein said transparent plate of said probe position inspection apparatus is disposed near said chuck stage.

19. A method of inspecting a semiconductor device through the use of an apparatus for inspecting a semiconductor device,
the apparatus for inspecting a semiconductor device comprising:
a probe position inspection apparatus comprising:
a transparent plate;
a camera for taking an image of one surface of said transparent plate; and
a pressure passive member covering the other surface, opposite to the one surface, of said transparent plate,
wherein the tip of a probe for use in evaluation of a semiconductor device is pressed against said other surface of said transparent plate, with said pressure passive member therebetween,
said probe position inspection apparatus further comprising an image processor for processing the image taken by said camera to detect the position of said probe in the plane of said transparent plate;
a chuck stage for placing said semiconductor device thereon;
said probe coming into contact with said semiconductor device; and
a test controller for sending and receiving signals to and from said probe to thereby evaluate an electrical characteristic of said semiconductor device placed on the upper surface of said chuck stage, wherein said transparent plate of said probe position inspection apparatus is disposed near said chuck stage;
said method comprising:
(a) taking an image of said one surface of said transparent plate, with said pressure passive member pressed by said probe, said (a) being performed by said camera;
(b) processing the image taken by said camera to detect the position of said probe, thereby judging whether the position of said probe coincides with a previously determined position or not, said (b) being performed by said image processor; and
(c) determining whether to perform an evaluation of an electrical characteristic of said semiconductor device or not, based on the result of judgement of said image processor, said (c) being performed by said test controller.

* * * * *